United States Patent [19]

Schadt et al.

[11] Patent Number: 5,527,566
[45] Date of Patent: Jun. 18, 1996

[54] CONDITIONING OF A POLYMERIC SUBSTRATE

[75] Inventors: Mark J. Schadt, Vestal; Alfred Viehbeck, Stormville, both of N.Y.

[73] Assignee: International Business Machines Corporation, Armonk, N.Y.

[21] Appl. No.: 414,140

[22] Filed: Mar. 30, 1995

Related U.S. Application Data

[63] Continuation of Ser. No. 701,924, May 17, 1991, abandoned.

[51] Int. Cl.$^6$ .................................................. H05H 1/00
[52] U.S. Cl. .......................... 427/536; 427/553; 427/557; 427/98; 427/307; 427/404; 427/443.1
[58] Field of Search ................. 427/98, 307, 443.1, 427/553, 557, 536, 404

[56] References Cited

U.S. PATENT DOCUMENTS

| | | | |
|---|---|---|---|
| 4,112,139 | 9/1978 | Shirk et al. | 427/54 |
| 4,287,253 | 9/1981 | Leech | 428/323 |
| 4,308,301 | 12/1981 | Huss | 427/307 |
| 4,357,203 | 11/1982 | Zelez | 156/643 |
| 4,382,101 | 5/1983 | Polak | 427/40 |
| 4,395,434 | 7/1983 | Imada et al. | 427/40 |
| 4,448,804 | 5/1984 | Amelio et al. | 427/98 |
| 4,478,883 | 10/1984 | Bupp et al. | 427/97 |
| 4,548,867 | 10/1985 | Ueno et al. | 427/40 |
| 4,554,182 | 11/1985 | Bupp et al. | 427/304 |
| 4,609,445 | 9/1986 | Collins | 204/165 |
| 4,639,380 | 1/1987 | Amelio et al. | 427/97 |
| 4,714,658 | 12/1987 | Kadajh et al. | 427/40 |
| 4,816,115 | 3/1989 | Horner et al. | 156/643 |
| 4,897,153 | 1/1990 | Cole et al. | 427/307 |
| 4,956,197 | 9/1990 | Babu et al. | 427/98 |
| 4,990,363 | 2/1991 | Suhr et al. | 427/98 |

*Primary Examiner*—Benjamin Utech
*Attorney, Agent, or Firm*—Pollock, Vande Sande & Priddy

[57] ABSTRACT

A polymeric substrate is exposed to an oxygen containing plasma; and then exposed to a reducing atmosphere at an elevated temperature. The reducing treatment reverses the effects on the polymer surface chemistry imparted by action of the oxidizing plasma. In this manner, the original electroactive properties of certain polymers are regenerated at the surface.

25 Claims, No Drawings

CONDITIONING OF A POLYMERIC SUBSTRATE

This application is a continuation of Ser. No. 07/701,924 filed May 17, 1991, now abandoned.

TECHNICAL FIELD

The present invention is concerned with conditioning a polymeric substrate, and especially conditioning a polymeric substrate for subsequent plating therein from an electroless plating bath. The present invention is concerned with activating a polymeric substrate that has been exposed to an oxygen-containing plasma.

BACKGROUND ART

In semiconductor chip fabrication and packaging, the steps of etching different layers are among the more critical and crucial steps. Methods that are commonly used for the selective etching of organic polymers, including photoresists and dielectric substrates, include dry etching processes such as oxygen plasma etching and reactive ion etching in an oxygen containing plasma.

Oxygen plasma etching is a procedure that generally involves filling a container such as a bell jar with gas capable of providing chemically reactive oxygen ions. The substrate which is to be etched is covered by a mask and introduced into the container along with the reactive gas. The reactive gas is usually disassociated forming positive and negative ions by coupling radio frequency power to the plasma by a capacitive or inductive coupling. It is believed that the disassociated ions then chemically interreact with the surface to be etched. In such a process, the substrates are positioned either on a ground plane or at the same potential as the plasma gases.

In reactive ion etching, generally a container such as a bell jar is filled with a gas capable of providing chemically reactive oxygen ions. The cathode is negatively biased relative to the anode, for instance, by means of an applied radio frequency signal. The surface to be etched is covered by a suitable mask and is then placed on the cathode. By applying an electric field, the reactive gas disassociates and the chemically reactive oxygen gas ions are attracted to the cathode. It is believed that the surface is etched both by chemical interreaction with the active ions and by the momentum transfer of the ions impinging on the surface.

These etching processes employing an oxygen containing plasma have particular application for pattern transfer into organic polymeric dielectric substrates. In similar manner, oxygen containing plasma processes are used to clean polymeric surfaces to remove impurities therefrom. The organic polymeric substrates readily oxidize under oxygen containing plasma conditions forming volatile products that are easily removed. However, surface oxidation is known to occur (in varying degrees), wherever the polymer is exposed to the plasma process including on the walls of etched vias. Likewise, dry etch chemistries leave behind a surface which is qualitatively different from that obtained by wet etching. Accordingly, subsequent process steps that depend upon the nature of such surface are effected.

For successful substitution of dry etch technology into process flows which previously utilized wet etch technologies, it is necessary that the polymeric surface be compatible with the next, previously-determined process step or that new subsequent process steps be developed. Since oxygen plasma and oxygen reactive ion etching processing of various organic polymeric materials may result in the ubiquitous surface oxidation of the exposed polymeric material, many processes employed following wet etching techniques fail when attempted using dry etch processes. By way of example, subsequent plating of a polymeric substrate including polyimides employing an electroless plating bath is problematic.

SUMMARY OF THE INVENTION

The present invention provides for a process to overcome the oxidation caused to the exposed polymeric material due to the dry process, such as an etching process, employing the oxygen containing atmosphere. The process of the present invention makes it possible to reactivate the exposed polymeric material whereby such can be subsequently plated employing an electroless plating bath.

In particular, the process of the present invention includes exposing a polymeric substrate to an oxygen containing plasma. The entire polymeric substrate or only selective regions thereof can be exposed to the oxygen containing plasma. The polymeric substrate is subsequently exposed to a reducing atmosphere at elevated temperature. The elevated temperature is at least about 120° C.

The present invention is also concerned with subsequently activating regions of the polymeric substrate by depositing a seed thereon. In addition, regions of the polymeric material according to the present invention after the seeding can be plated with a metal from an electroless plating bath.

BEST AND VARIOUS MODES FOR CARRYING OUT PRESENT INVENTION

The process of the present invention is applicable to treating or conditioning a wide variety of dielectric (non-conductor) substrates. Dielectric substrates described including thermoplastic and thermosetting resins, may be treated in accordance with the present invention.

Typical thermosetting polymeric materials include epoxy, phenolic based materials, and polyimides. The dielectric materials may be molded articles of the polymers containing fillers and/or reinforcing agents such as glass filled epoxy or phenolic based materials. Examples of some phenolic type materials include copolymers of phenol, resorcinol, and cresol. Examples of some suitable thermoplastic polymeric materials include polyolefins such as polypropylene, polysulfones, polyethylene terephthalate, polycarbonates, nitrile rubbers, ABS polymers and polyimides.

The terms "substrate" and "surface", as employed herein, includes surfaces inside through holes or vias as well as major surface of a substrate.

Preferred polymeric materials subjected to the process of the present invention are the polyimides. The polyimides include unmodified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

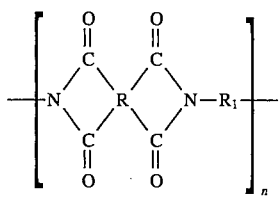

where n is an integer representing the number of repeating units to provide a molecular weight usually about 10,000 to about 100,000. R is at least one tetravalent organic radical selected from the group consisting of:

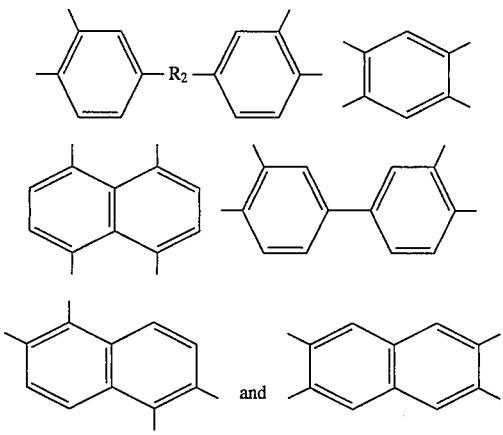

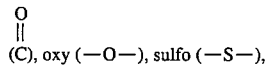

$R_2$ being selected from the group consisting of divalent aliphatic hydrocarbon radicals having from 1 to 4 carbon atoms and carbonyl (C), oxy (—O—), sulfo (—S—), fluorocarbons (e.g., $C_nF_{2n}$ wherein n is an integer of 1–10) such as hexafluoroisopropylidene and sulfonyl (—$SO_2$—) radicals and in which $R_1$ is at least one divalent radical selected from the group consisting of:

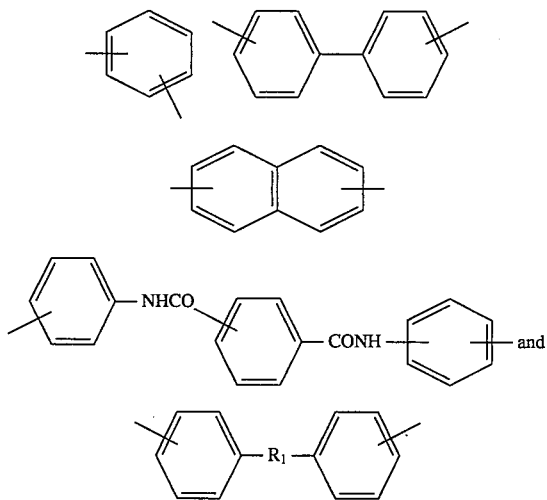

in which $R_3$ is a divalent organic radical selected from the group consisting of $R_2$, silicon, and amino radicals. Polymers containing two or more of the R and/or $R_1$ radicals, especially multiple series of $R_1$ containing amido radicals, can be used.

In accordance with that aspect, of the present invention concerned with etching, portions of the polyimide are imagewise selectively exposed to a dry etching procedure employing an oxygen containing atmosphere. In particular oxygen plasma and oxygen reactive ion etching techniques can be used. In oxygen plasma etching, a power range of from about 100 to about 400 watts and preferably about 300 watts can be employed. Etching is normally carried out to the endpoint and preferably to endpoint+30% to assure complete etching. The endpoint as used in the art refers to that determined by monitoring a point of the surface being etched by laser to determine when such has been completely removed and the underlying surface is exposed. The chamber for carrying out the etching normally contains oxygen to a pressure of>about 1 torr and preferably about 1–3 torr. The gas or gasses employed are usually ultrapure and a typical gas mixture composed of about 1 to about 30% $CF_4$ or $SF_6$ with about 99 to about 70% oxygen. A preferred mixture contains 10% $CF_4$ or $SF_6$ and 90% $O_2$. The preferred flow rate of the gasses employed is approximately 100 sccm.

In an oxygen containing reactive ion etching technique, the substrate to be selectively etched is placed on a cathode plate connected to a cathode which is typically a radio frequency electrode. Also included in such a configuration is an anode and a power source such as an AC and preferably a radio frequency power source.

The reactive ion etching is generally carried out under vacuum at pressures<about 15 millitorr, and preferably about 5 to about 8 millitorr in batch processing systems.

A convenient power density for operating the radio frequency power source is <0.5 and preferably about 0.2 to about 0.4 watts per cm2 of the cathode for batch systems.

The flow rate of the oxygen is generally at least about 10 cc/min., with a preferred flow rate being about 10 to about 30 cc/min. The residence time of the oxygen is generally about 10 to about 35, seconds and preferably about 25 seconds.

The polymeric substrate to be etched may be coated with an inorganic barrier layer such as silicon nitride or silicon oxide and patterned by employing well known photolithographic techniques. This patterned inorganic layer may then serve as a mask for pattern transfer (by oxygen containing dry etch processes) into the underlying polymer material. Using such a process sequence, the thickness of the photoresist may be selected so that it is completely etched from the inorganic surface during the dry etching of the polymer substrate. Alternately, an inorganic-containing photoresist may be employed and the inorganic barrier layer omitted. Oxygen plasma etching of selected portions of the polymeric substrate is usually completed (for a 1 μm thick polymer) in about 10–20 minutes and preferably about 15 minutes.

The portions of the substrate that were exposed to the oxygen plasma such as the walls of any through holes are next exposed to a reducing atmosphere. Typical reducing atmospheres include hydrogen gas, with a preferred gas mixture containing about 2 to about 10% by volume hydrogen in a mixture with about 98 to about 90% diluent gas such as nitrogen. A preferred gas mixture contains about 10% hydrogen and about 90% nitrogen.

The substrate must be at a temperature of about 120° to about 450° C. and preferably about 200° to about 400° C. During this step of the process the treatment in the reducing atmosphere is usually carried out for about 15 to about 60, and preferably about 20 to about 30 minutes. A temperature ramp sequence is preferred such as 10 minutes at 200° C., followed by 10 minutes at 300° C. and then followed by 10 minutes at 400° C. Alternatively, rapid infrared heating or microwave heating can be used. In the case of microwave heating, it is preferred to use a single mode cylindrical cavity and powers up to 500 watts employed. The flow rate of the $H_2/N_2$ is typically about 5 sccm.

After completion of this step, the polymeric surface treated can now be subjected to usual processing to provide a metallic film from an electroless plating bath. The damage to the polymeric surface caused by the oxygen etching is reversed by the annealing step in the chemically reducing atmosphere.

Next, the substrate can be activated by contact with a composition containing a catalytic composition capable of initiating an electroless plating process. The composition contain a metal which can directly provide the catalytic sites or serves as a precursor which leads to the catalytic sites. The metal present may be in the elemental form, an alloy, or compound, or mixtures thereof. The preferred metal catalysts are precious metals such as gold, palladium, and platinum. In addition, in view of the improved conditioning of the substrate achieved according to the present invention, the catalyst can be a non-precious metal such as copper, nickel, cobalt, iron, zinc, manganese, and aluminum.

The most preferred catalyst is palladium. A typical palladium composition contains about 1.2–2.5 grams/liter of a palladium salt which is preferably $PdCl_2$, about 80–150 grams/liter of a stannous salt which is preferably $SnCl_2 \cdot 2H_2O$, and about 100–150 milliliters per liter of an acid which is preferably HCl. When HCl is provided in the form of a 37% HCl solution, about 290 to 360 milliliters of the HCl solution is preferably employed. The most preferred composition contains about 1.5 grams per liter of $PdCl_2$, about 80 grams per liter of $SnCl_2$, and about 280 milliliters per liter of 37% HCl. The composition is usually maintained at a temperature of 65°+−10° F.

Other Pd seeding methods are disclosed in U.S. Pat. Nos. 4,710,403 to Krause et al., 4,512,855 to Mazur et al., and U.S. patent application Ser. No. 07/290,486, disclosures of which are incorporated herein by reference. These methods require that the polyimide film contains no surface alteration and that the surface be comprised of polyimide. The imide form of polyimide is necessary because the imide possesses electroactive functionality which is a prerequisite for operation of these processes.

Next, a metal can be plated from an electroless plating bath onto the seeded portions of the substrate including on the walls of the through holes.

Suitable electroless metal plating baths include nickel, copper, gold, cobalt, and palladium electroless metal plating baths with nickel and copper being preferred and copper being most preferred. The typical copper electroless metal plating baths and their method of application are disclosed in U.S. Pat. Nos. 3,844,799 and 4,152,467, disclosures of which are incorporated herein by reference.

The copper electroless metal plating bath is generally an aqueous composition which includes a source of cupric ion, a reducing agent, a complexing agent for the cupric ion, and a pH adjuster. The plating baths also typically include a cyanide ion source and a surfactant.

The cupric ion source is generally cupric sulfate or a cupric salt of the complexing agent to be employed. When employing cupric sulfate, it is typical to use amounts from about 3 to about 15 grams/liter and more typically from about 8 to 12 grams/liter. The most common reducing agent employed is formaldehyde which typically is used in amounts from about 0.7 to about 7 grams per liter and more typically from about 0.7 to about 2.2 grams per liter. Examples of other reducing agents include formaldehyde precursors or derivatives such as paraformaldehyde, trioxane, dimethylhydantoin, glyoxal; borohydrides such as alkali metal borohydrides (sodium and potassium borohydride) and substituted borohydrides such as sodium trimethoxy borohydride; boranes such as amine boranes (isopropyl amine borane and morpholine borane). Hypophosphite reducing agents can be used for electroless nickel and copper plating baths.

Examples of some suitable complexing agents include rochelle salts, ethylene diamine tetraacetic acid, the sodium (mono-, di-, tri- and tetra-sodium) salts of ethylene diamine tetraacetic acid, nitrilotetraacetic acid and its alkali salts, gluconic acid, gluconates, triethanol amine, glucono-(gamma)-lactone, modified ethylene diamine acetates such as N-hydroxyethyl ethylene diamine triacetate. In addition, a number of other suitable cupric complexing agents are suggested in U.S. Pat. Nos. 2,996,408, 3,075,856, 3,075,855 and 2,938,805. The amount of complexing agent is dependent upon the amount of cupric ions present in the solution and is generally from about 20 to about 50 grams/liter or in a 3–4 fold molar excess.

The plating bath can also contain a surfactant that assists in wetting the surface to be coated. A satisfactory surfactant is, for instance, an organic phosphate ester available under the trade designation Gafac Re-610. Generally, the surfactant is present in amounts from about 0.02 to about 0.03 grams/liter. In addition, the pH of the bath is also generally controlled, for instance, by the addition of a basic compound such as sodium hydroxide or potassium hydroxide in the desired amount to achieve the desired pH. The typical pH of the electroless plating bath is between about 11.6 and about 11.8.

Also, the plating bath usually contains a cyanide ion and most typically contains about 10 to about 25 milligrams per liter to provide a cyanide ion concentration in the bath within the range of 0.0002 to about 0.0004 molar. Examples of some cyanides which can be employed are the alkali metal, alkaline earth metals and ammonium cyanides. In addition, the plating baths can include other minor additives as is well known in the prior art.

The plating baths generally have a specific gravity within the range of 1.06 to 1.08. In addition, the temperature of the bath is typically maintained between 70° and 80° C., and more typically between about 70° and about 75° C. For a discussion of plating temperatures coupled with the more typical cyanide ion concentration, see U.S. Pat. No. 3,844,799.

Also, the oxygen content of the bath is generally maintained between about 2 ppm and about 4 ppm and preferably about 2.5 to about 3.5 ppm as discussed in U.S. Pat. No. 4,152,467. The oxygen content can be controlled by injecting oxygen and an inert gas to the bath.

The overall flow rate of gases into the bath is generally from about 1 to about 20 SCFM per 1000 gallons of bath and more typically from about 3 to about 8 SCFM per 1000 gallons of bath.

The following non-limiting examples are presented to further illustrate the present invention.

EXAMPLE 1

A film of Dupont Pyralin® 2545 is coated onto a silicon wafer to a thickness of about 10,000 angstroms and thermally imidized to 400° C. The film is then exposed to an oxygen reactive ion etching process to remove about 5,000 angstroms of the film. The sample is then annealed in a forming gas of 10% $H_2$ and 90% $N_2$ at about 400° C. for about 30 minutes. The film is then seeded with a palladium catalyst as described in U.S. patent application Ser. No. 07/290,486, and plated with copper from an electroless copper plating bath to provide a copper film of about 3,000 angstroms thereon.

However, carrying out the same process except excluding the annealing step in the forming gas, results in no significant electroless deposition.

EXAMPLE 2

About 2 000 angstroms of $Si_3N_4$ are deposited on 5 inch silicon wafers. Dupont Pyralin® 2810 polyimide is spun onto the substrate and thermally cured to give a 0.8 micron thick film. Next about 1,000 angstroms of $Si_3N_4$ are blanket deposited. A 1.2 μm thick positive tone novolak resin photoresist film is coated onto the $Si_3N_4$ and subjected to a photolithographic technique to provide a desired mask. The 1,000 angstroms nitride layer is etched employing a freon reactive ion etching using the photoresist as a mask.

The etching is carried out in a batch reactor using a $CF_4$ etchant gas, at a flow rate of 20 sccm, a DC bias −400 volts, about 50 millitorr, a power of 300 watts, and power density of 0.20 watts/cm$^2$.

Next, the 0.8 μm polyimide layer is etched employing an oxygen reactive ion etching using the nitride as the etch mask.

This etching is carried out in a batch reactor, using oxygen gas etchant at a flow rate of 20 sccm, a DC bias of −630 volts, a base pressure of 5 millitorr, power of 600 watts and power density of 0.28 watts/cm$^2$.

The oxygen reactive ion etching also removed the photoresist layer leaving a structure with $Si_3N_4$ at the top and bottom and polyimide sidewalls with the etch carried to endpoint plus 30–40%.

The structure is then thermally annealed by placing it in a tube and ramping up the temperature in the presence of forming gas of 10% $H_2$ and 90% $N_2$ to about 400° C. for about 30 minutes and held at about 400° C. for another 30 minutes.

The structure is then seeded with a palladium catalyst as in Example 1 above, forming on the sidewalls of the polyimide holes, followed by plating in an electroless copper bath for about 25 minutes. This results in a continuous copper film of about 3000 angstroms thick.

On the other hand, when the same process without the annealing in the forming gas is carried out, only small copper nodules are present on the polymer sidewalls with most of the polymer surface being uncoated. Also the copper is not a continuous metal film as achieved by employing the technique of the present invention.

What is claimed is:

1. A method of conditioning a polymeric substrate for electroless plating which comprises:
   exposing a polymeric substrate to an oxygen containing plasma: and
   subsequently exposing said polymeric substrate in the absence of a plasma to a reducing atmosphere at elevated temperature of at least about 120° C. wherein said reducing atmosphere contains hydrogen to thereby reactivate said polymeric substrate;
   and further comprising after the exposing to said reducing atmosphere, activating regions of said polymeric substrate by depositing a catalytic seed metal thereon.

2. The method of claim 1 wherein said temperature is about 300° to about 400° C.

3. The method of claim 1 wherein said elevated temperature is reached by a stepwise temperature ramp process.

4. The method of claim 1 wherein said elevated temperature is achieved by microwave irradiation.

5. The method of claim 1 wherein said elevated temperature is achieved by infrared irradiation.

6. The method of claim 1 wherein said atmosphere also contains a diluent gas.

7. The method of claim 6 wherein said diluent gas is argon.

8. The method of claim 6 wherein said diluent gas is nitrogen.

9. The method of claim 8 wherein the amount of hydrogen is about 2 to about 10% by volume and said nitrogen is about 98 to about 90% by volume.

10. The method of claim 1 wherein oxygen gas contains ultrapure oxygen to a pressure of greater than 1 torr.

11. The method of claim 10 wherein said pressure is about 1 to about 3 torr.

12. The method of claim 1 wherein the plasma gas is a mixture containing about 1 to about 30% $CF_4$ gas by volume and about 99 to about 70% oxygen gas by volume.

13. The method of claim 12 wherein said mixture contains about 10% $CF_4$ gas by volume and the flow rate is about 100 sccm.

14. The method of claim 1 wherein the plasma gas is a mixture containing about 1 to about 30% $SF_6$ gas by volume and about 99 to about 70% oxygen gas by volume.

15. The method of claim 14 wherein said mixture contains about 10% $SF_6$ gas by volume and the flow rate is about 100 sccm.

16. The method of claim 1 wherein the exposing to said reducing atmosphere is carried out for at least about 5 minutes.

17. The method of claim 1 wherein the exposing to said reducing atmosphere is carried out for about 20 to about 30 minutes.

18. The method of claim 1 wherein said polymeric substrate contains a polyimide or polyethylene terephthalate.

19. The method of claim 1 wherein said catalytic seed metal includes palladium.

20. The method of claim 1 which further comprises contacting activated regions with an electroless plating bath to deposit an electrically conductive metal thereon.

21. The method of claim 20 wherein said electrically conductive metal is copper or nickel.

22. The method of claim 20 wherein said electrically conductive metal is copper.

23. The method of claim 1 wherein regions of said polymeric substrate less than the entire substrate are imagewise exposed to plasma.

24. The method of claim 1 wherein said polymeric substrate is blanket exposed to said oxygen containing plasma.

25. The method of claim 1 wherein said polymeric substrate contains a polyimide.

\* \* \* \* \*